United States Patent [19]

Smith et al.

[11] Patent Number: 5,347,422
[45] Date of Patent: Sep. 13, 1994

[54] APPARATUS AND METHOD FOR AN IGNITION SYSTEM

[75] Inventors: Kenneth W. Smith; Bruce E. Dolmovich; John R. Frus, all of Jacksonville, Fla.

[73] Assignee: Unison Industries Limited Partnership, Jacksonville, Fla.

[21] Appl. No.: 942,654

[22] Filed: Sep. 9, 1992

[51] Int. Cl.$^5$ .................................................. F23Q 3/00
[52] U.S. Cl. .......................... 361/253; 315/209 CD; 315/209 M; 60/39.06; 60/39.827; 361/257
[58] Field of Search ............... 361/247, 253, 254, 255, 361/256, 257, 263; 123/598, 606, 607, 608, 637; 60/39.06, 39.827; 315/209 R, 209 T, 209 CD, 209 M

[56] References Cited

U.S. PATENT DOCUMENTS

| | | | |
|---|---|---|---|
| 3,569,727 | 3/1971 | Aggarwal | 307/106 |
| 3,835,350 | 9/1974 | Thakore | 315/209 CD |
| 4,064,415 | 12/1977 | Blackington | 315/209 T |
| 4,103,659 | 8/1978 | Donigian | 315/209 M |
| 4,414,804 | 11/1983 | Menard et al. | 60/39.827 |
| 4,967,037 | 10/1990 | Roberts | 123/598 |
| 4,983,886 | 1/1991 | Balland | 315/209 CD |
| 5,049,786 | 9/1991 | Gotisar et al. | |
| 5,053,913 | 10/1991 | Lozito et al. | 361/254 |
| 5,056,496 | 10/1991 | Morino et al. | 315/209 CD |
| 5,065,073 | 11/1991 | Frus | 315/209 CD |
| 5,148,084 | 9/1992 | Frus | 315/209 M |

FOREIGN PATENT DOCUMENTS

| | | |
|---|---|---|
| 3-189367 | 8/1991 | Japan. |
| 997139 | 7/1965 | United Kingdom. |
| 1108636 | 4/1968 | United Kingdom. |
| 2189840 | 11/1987 | United Kingdom. |

OTHER PUBLICATIONS

Lawatsch et al., "Protection of Thyristors Against Overvoltage with BOD (Break–Over Diodes)," *Conference Record of IEEE/IAS 1985 Annual Meeting,* CH2207-9, 935–939 (1985).

*Primary Examiner*—Jeffrey A. Gaffin
*Attorney, Agent, or Firm*—Leydig, Voit & Mayer, Ltd.

[57] ABSTRACT

An ignition system is provided that marries a free-running discharge circuit with a fast-charging, high voltage converter without resulting in an excessive rate of discharge. To this end, the free-running discharge circuit employs a passive switch embodied either as a spark-gap device or a passive network of semiconductor elements. A feedback circuit detects discharge events at the discharge circuit and, in response thereto, selectively enables and disables the fast-charging converter. A spark rate clock is integrated into the feedback circuit for the purpose of setting the average discharge rate to a predetermined value.

9 Claims, 5 Drawing Sheets

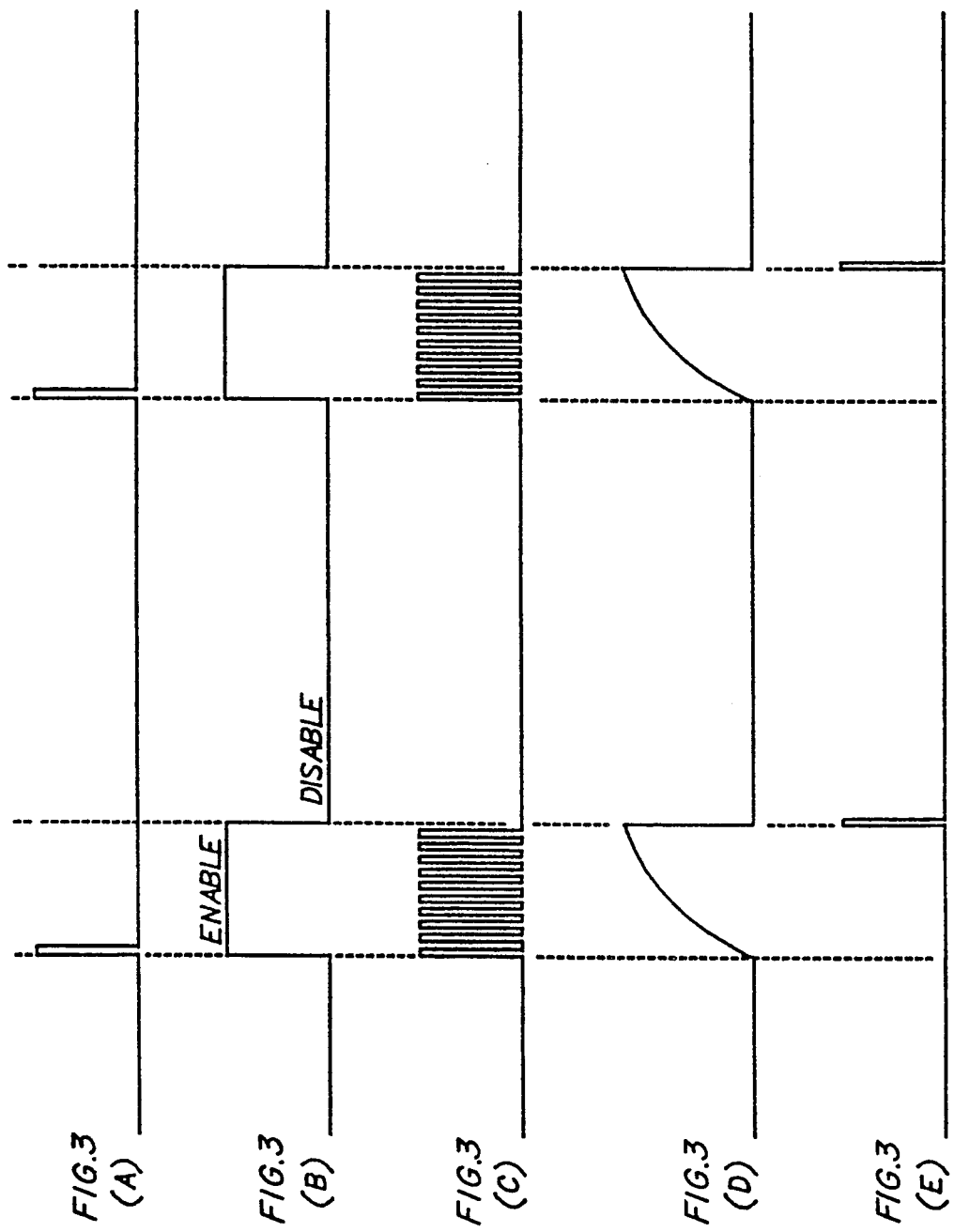

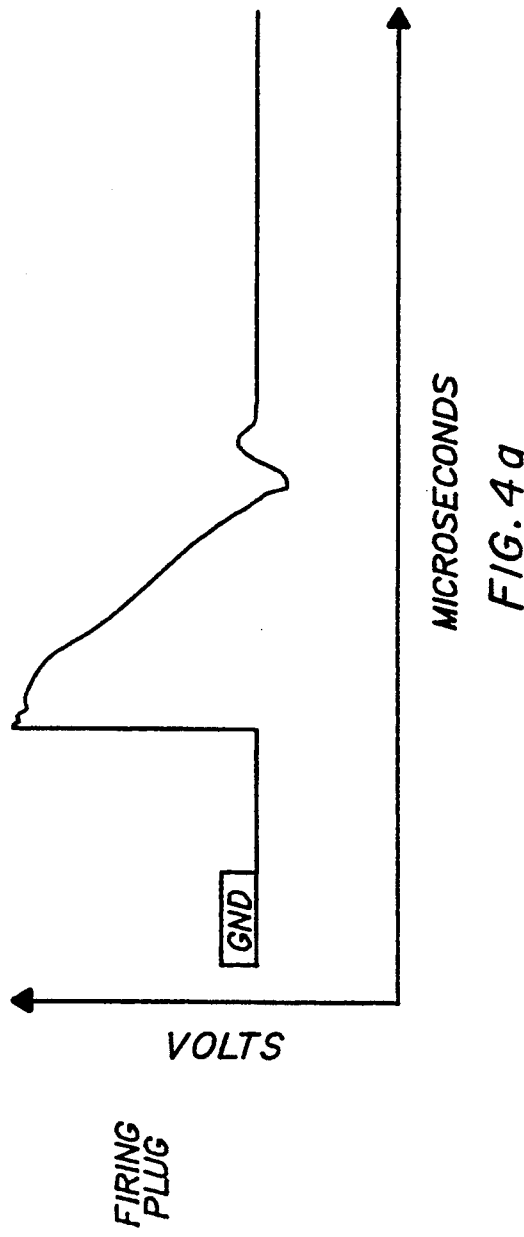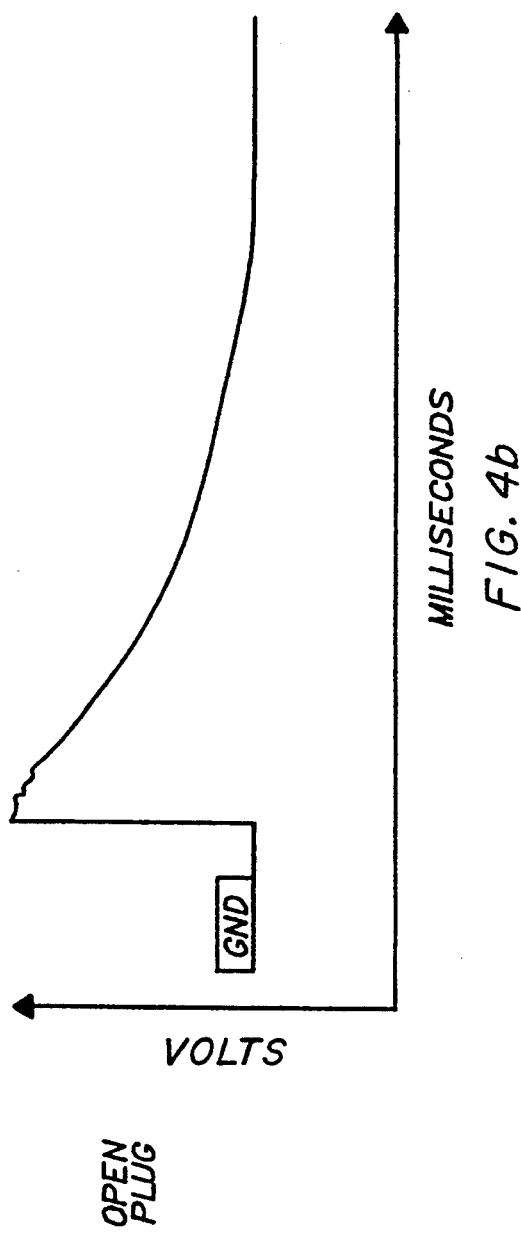

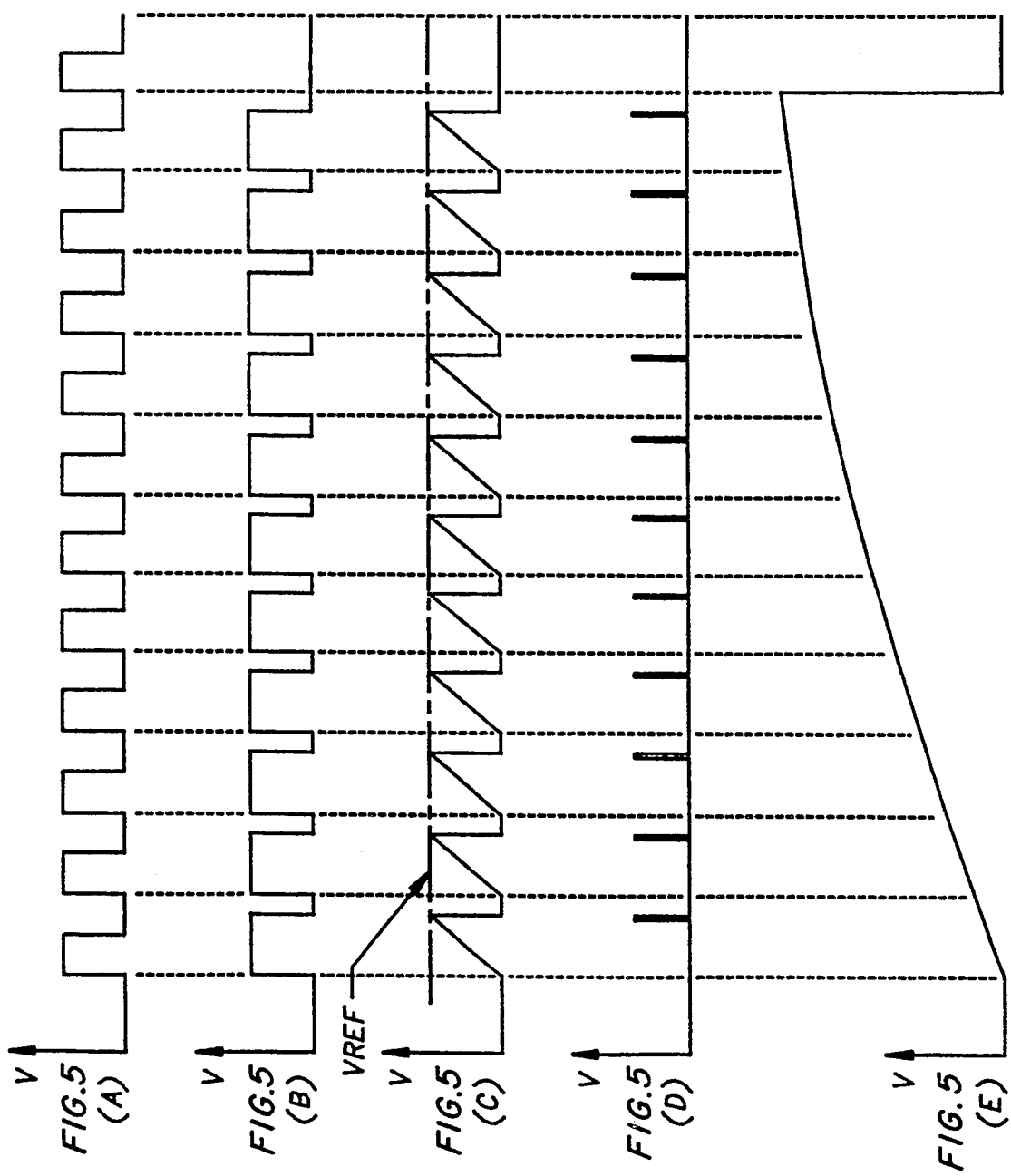

APPARATUS AND METHOD FOR AN IGNITION SYSTEM

TECHNICAL FIELD

The invention generally relates to ignition systems for turbine engines and more particularly relates to ignition systems using spark-gap devices for triggering the discharge of stored energy into an ignition plug.

BACKGROUND

Conventional spark ignition systems for aircraft turbines use a spark-gap device to control the flow of energy to igniter plugs by way of charge/discharge cycles, which produce sparks at one or more of the plugs for igniting fuel in the combustor of the turbine engine. In such systems, a high voltage power source charges a storage capacitor at a predetermined rate. As the capacitor is charged, the DC voltage at the terminal of the capacitor rises, but the spark-gap device keeps it disconnected from the igniter plug by acting like an open switch. The spark-gap device has a preset breakdown voltage. When the voltage of the capacitor rises to that preset value, the spark-gap device fires (i.e., becomes a closed switch) and discharges the capacitor through an output circuit to the one or more igniter plugs.

The discharge event is relatively instantaneous compared to the time taken to charge the storage capacitor. When the discharge event occurs, the storage capacitor begins a new cycle by recharging at the same predetermined rate as in the previous cycle. This rate is determined by the design of the high-voltage power source. The charge/discharge cycle is thus repetitive and repeats at a rate which is inversely related to the time required to charge the storage capacitor to the breakdown voltage of the spark-gap device. This mode of operation is continuous and free-running—i.e., it is not controlled by a clock or timing device.

Spark-gap devices are very good at switching the high voltage and current of an ignition system from a storage device to an output igniter plug. Furthermore, spark-gap devices are robust and adaptable to the severe environmental extremes experienced by turbine engines in some of their common applications (e.g., aircraft). Moreover, spark-gap devices are well-known two-terminal "passive" devices, meaning they do not require application of external control and/or power signals to function properly. Therefore, they are relatively simple and inexpensive to integrate into a design for an ignition system since they do not require special circuitry.

Until recently, the typical DC ignition system utilized a low frequency blocking oscillator as a high voltage DC-DC converter. This converter depended on the Beta factor of the power transistor to regulate the power processed and has no means for spark rate control over a wide input voltage range. This converter typically would charge the tank capacitor in 500–1000 ms, providing a one (1) to two (2) spark per second output. The power transformer utilized in this DC-DC converter was typically a laminated iron core transformer that was heavy and large. The converter illustrated in FIG. B on page 229 of A. H. Lefebvre's "Gas Turbine Combustion", Hemisphere Publishing Corporation, (1983), is an example of a low frequency blocking oscillator used as a high voltage DC-DC converter.

Newer designs of spark ignition systems employ improved high voltage converters as the power source to charge storage capacitors. These converters are able to charge storage capacitors of ignition systems many times faster than previous converters, by taking advantage of the improvements in magnetic materials and integrated circuits, which enables more power to be processed per unit volume of the transformer, with a resulting reduction in weight and increase in system efficiency. To utilize these new materials, these improved high voltage converters oscillate at a much higher frequency than traditional converters such as the one illustrated in the above-identified Lefebvre reference. Applications of these newer converters have in the past typically been limited to use with discharge circuits that have a controlled rate of discharge. For example, U.S. Pat. No. 5,065,073 to Frus discloses a fast charging, high voltage converter used with a solid-state discharge circuit which depends on an external trigger for initiating a discharge event. By providing an external trigger, the spark rate is controlled. If these new converters are utilized in free-running ignition systems, however, the spark repetition rates are much higher than required to light the turbines and result in accelerated wear of the igniter plugs. Unfortunately, these solid-state discharge circuits are not as robust and rugged as the more conventional free-running discharge circuits using spark-gap devices.

SUMMARY OF THE INVENTION

It is the primary object of the invention to marry the new fast-charging converters with a passive, two-terminal switch in discharge circuits, without resulting in an excessive rate of discharge.

It is a more specific object of the invention to regulate the spark rate of an ignition system employing a passive, two-terminal switch so that the discharge circuit is not free-running. It is a related object of the invention to accurately set the spark rate so that it is substantially independent from external variations such as input voltage level and operating temperature.

It is a further object of the invention to provide multiple passive, two-terminal switches powered by the same high energy, fast charging converter such that the spark rate associated with each switch is controlled.

It is a separate and still further object of the invention to extract diagnostic information from a signal controlling the spark rate that can be processed by circuitry to indicate the health of the system, especially that of the igniter plugs which have a finite life cycle and require periodic replacement.

Other objects and advantages of the invention will be apparent from the following detailed description and the accompanying drawings.

Briefly, the invention provides a feedback network in the ignition system, which indicates the passive, two-terminal switch has closed and resets a logic circuit that controls the initiation of successive charging cycles executed by a high energy, DC-to-DC converter that pumps energy into a storage capacitor. In one embodiment, the passive, two-terminal switch is a conventional spark-gap device. In an alternative embodiment, a passive network of semiconductor elements is substituted for the spark-gap device. Like the spark-gap device, however, the passive network of semiconductor elements is a passive, two-terminal device that does not require external control and/or power circuitry.

BRIEF DESCRIPTION OF THE DRAWINGS

FIG. 3 is a series of exemplary waveforms (a) through (e) for the ignition system of FIG. 1;

FIGS. 4a and 4b are exemplary waveforms of the discharge voltages for healthy and unhealthy igniter plugs, respectively; and FIG. 5 is a series of exemplary waveforms (a) through (e) for the DC-DC converter in the ignition system of FIG. 1.

While the invention will be described in connection with a preferred embodiment, it will be understood that it is not intended to limit the invention to that particular embodiment. On the contrary, it is intended to cover all alternatives and equivalents as may be included within the spirit and scope of the invention as defined by the appended claims.

DETAILED DESCRIPTION OF THE PREFERRED EMBODIMENT

Figure 1:
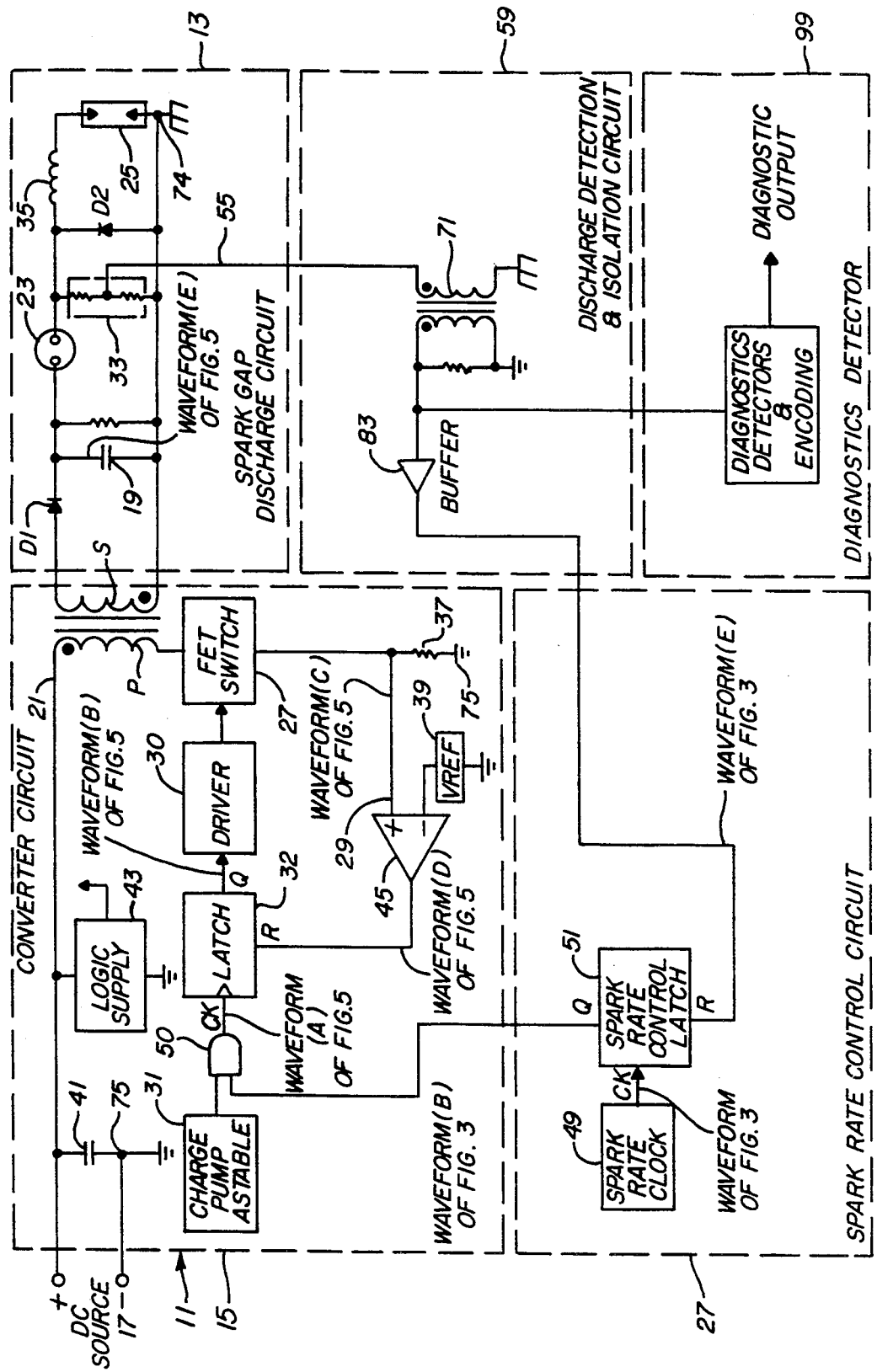
FIG. 1 is an ignition system for a turbine engine in accordance with the invention, wherein a solid-state DC-to-DC converter and a conventional spark-gap discharge device are used to provide a controlled spark rate at the igniter plug or plugs of the system.

Turning to the drawings and referring first to FIG. 1, an ignition system 11 includes a discharge circuit 13 and a converter circuit 15. The converter circuit 15 pumps energy from a DC source 17 into a storage capacitor 19 of the discharge circuit 13 by way of a power transformer 21 and a diode D1. When the energy stored in the storage capacitor 19 reaches a certain level, the gas within a conventional spark gap device 23 begins to form a plasma that provides a low ohmic path from the storage capacitor to an igniter plug 25, thus initiating a spark event at the plug. As the energy differential between the capacitor 19 and the igniter plug 25 subsides as a result of the spark event, the plasma dissipates and the spark gap device 23 returns to providing a high ohmic connection between the capacitor and the igniter plug. The high ohmic connection of the spark gap device 23 in effect isolates the capacitor 19 from the igniter plug 25, allowing the capacitor to build up charge and repeat the cycle of charging and discharging.

For purposes of definition, everything downstream of the storage capacitor 19 is considered to be part of "an output circuit." Primarily, the output circuit includes the spark gap device 23, the inductor 35, the igniter plug 25 and the safety resistor network 33.

Normally the controlling factor in determining the frequency of the spark event is the charging time of the storage capacitor 19. In this connection, the illustrated converter circuit 15 is a solid-state device of the type that provides relatively fast charging rates as exemplified by the converter in the aforementioned '073 patent to Frus, which is assigned to the same assignee as that of the present invention. Once the storage capacitor 19 reaches the threshold voltage at which the gap of the spark gap device 23 breaks down, the storage capacitor discharges through an output inductor 35, producing a spark at the gap of the igniter plug 25. The presence of a diode D2 in parallel with the igniter plug 25 in the output circuit results in a unipolar discharge from the discharge circuit 13.

In accordance with the invention, the rate of the spark events for an ignition system employing a passive, two-terminal device in its discharge circuit is controlled by selectively enabling and disabling the DC-to-DC converter. By selectively enabling and disabling the converter, the initiation of a charge cycle is controlled, thereby effectively controlling the spark rate of the discharge circuit whose circuitry is otherwise free-running. Even though the rate of charging the storage capacitor of the discharge circuit may vary from cycle to cycle, the average rate of discharge events is maintained constant by controlling when the charging of the capacitor is initiated.

Referring to the illustrated embodiment, in order to control the spark rate at the igniter plug 25, a spark rate control circuit 27 responds to the occurrence of a spark event detected by a discharge detection circuit 59 for the purpose of selectively enabling and disabling the converter 15. In particular, in the illustrated embodiment of FIG. 1, charge pump astable 31 of the converter circuit 15 is selectively enabled and disabled by the spark rate control circuit. An example of an appropriate device for the astable 31 is a SE555JG timer manufactured by Texas Instruments. This device has specifications suitable for operation in an environment characterized by large ranges in temperature. As illustrated in FIG. 1, the discharge circuit 13 of the ignition system according to the invention is conventional in its configuration except for a safety resistor network 33, which senses each discharge event. In general, any oscillatory or unipolar discharge circuit that utilizes a spark gap device can be incorporated into the present invention.

At the safety resistor network 33, each discharge event is sensed. In the illustrated embodiment, the network 33 comprises series connected resistors $R_1$ and $R_2$, which define a voltage divider that conditions the discharge signal by attenuating its amplitude. This signal is further conditioned by the discharge detection circuit 59 and fed back to the spark rate control circuit 27, indicating to the circuit that a discharge event has occurred.

Figure 2:
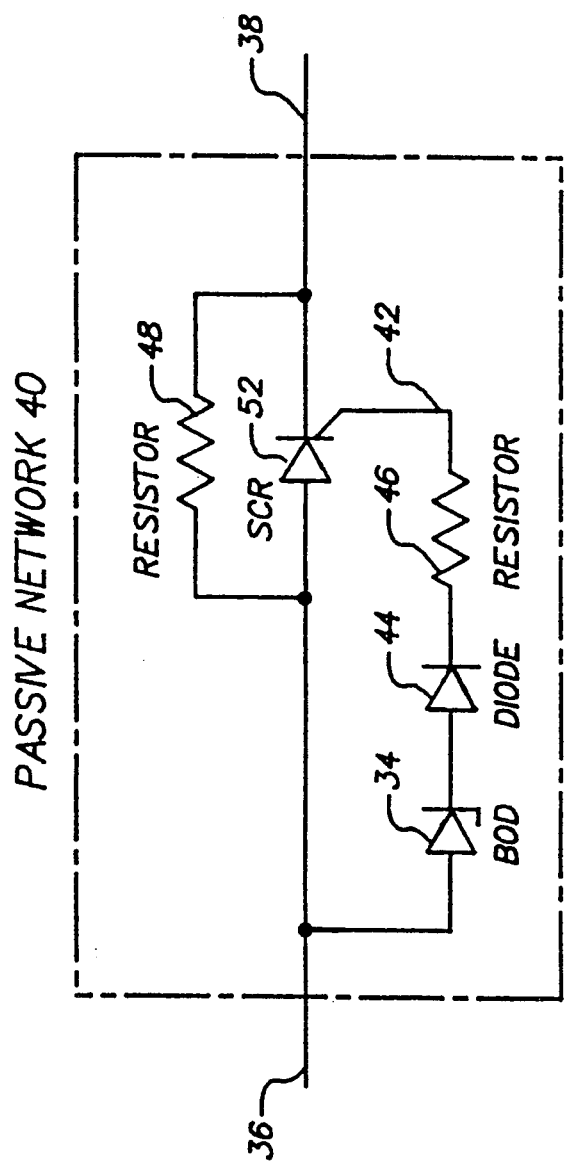
FIG. 2 is an exemplary passive network of semiconductor elements that form a passive, two-terminal device, which may be substituted for the spark-gap discharge device of FIG. 1.

In the illustrated discharge circuit 13, a single spark gap device 23 controls the discharging of the storage capacitor 19, which is connected in series with the igniter plug 25 by way of an inductor 35. Those skilled in the art will appreciate that passive, two-terminal devices other than spark-gap devices are also within the spirit of the invention. For example, the spark gap device 23 in FIG. 1 may be replaced by a passive network 40 of semiconductor elements comprising a silicon-controlled rectifier (SCR) 52 triggered by a break-over diode (BOD) 34 as shown in FIG. 2. The functioning of such a passive network in an ignition system is explained in detail in copending U.S. Application Ser. No. 07/943,928 to Dolmovich, filed Sep. 11, 1992, assigned to the same assignee as that of the present invention. In general, however, the anode 36 and cathode 38 of the SCR 52 define the input and output terminals of the passive device. The trigger input 42 of the SCR is connected to the anode 36 of the SCR 32 by way of the BOD 34. Although only one pair of SCR 32 and BOD 34 is illustrated (hereinafter a "stage"), it will be appreciated that the network 40 may comprise a plurality of stages connected in series to arrive at a desired overall voltage rating sufficient to hold off breakdown of the network 40 until a predetermined amount of energy has been stored in the capacitor 19. In this regard, the value of the breakdown voltage ($V_B$) of the BOD 34 is proportional to the voltage across the network ($\Delta V$) at which the network breaks down from a high impedance to a low impedance. Because there is only a small power throughout at the BOD 34, it can repeatedly be used to trigger the SCR 52 without affecting its reliability.

For each stage of the passive network 40, the BOD 34 may require a series-connected conventional diode 44 to protect the BOD from any possible reverse current that might be forced out of the gate of the SCR 52 during discharge of the capacitor 19. A resistor 46 in series with the BOD 34 and the diode 44 may also be required to limit the current through this path and into the gate of the SCR 52. A second resistor 48 in parallel with the SCR 52 provides voltage compensation by tending to keep the total voltage across the passive network 40 evenly divided between stages. Of course, if only a single stage is used to implement the passive network 40, the resistor 48 may not be needed.

During operation of the ignition system, a free-running spark rate clock 49 of the spark rate control circuit 27 provides a time base for setting an average spark rate of the system. An exemplary waveform of the time base is illustrated by waveform (a) in FIG. 3. The time base signals are fed to a spark rate control latch 51, which has a bistable output whose state is controlled by the clock pulses from the spark rate clock 49 and spark detection pulses from the discharge detection circuit 59. An exemplary waveform of the spark detection pulses is shown in waveform (e) of FIG. 3. In its functioning, the latch 51 is an edge triggered flip-flop and it includes a reset (R) input for receiving the spark detection pulses from the discharge detection circuit 47 and a clock (CK) input for receiving the clock pulses from the spark rate clock 49.

In order to control operation of the converter 15, the bistable output (Q) of the spark rate control latch 51, shown as waveform (b) in FIG. 3, drives an enable/disable (E/D) gate (50) with the charge pump astable 31 in the converter.

By resetting the output of the spark rate control latch 51, the charge pump astable 31 is disabled. This causes the ignition system 11 to enter a standby condition until the next clock pulse is generated by the spark rate clock 49. When the next spark rate clock pulse arrives, the entire cycle repeats itself, keeping the average spark rate constant over the ambient temperature and input voltage range. In this regard, the charging rate of the capacitor 19 may fluctuate in response to changes in ambient temperature, input voltage and other factors, causing the instantaneous spark rate to fluctuate. However, because each charge/discharge cycle of a spark event is initiated by the pulses from the latch 51, which are synchronized to the clock 49, the average spark rate remains constant and proportional to the constant frequency of the signals from the clock 49.

By employing a transformer at each of the interfaces between the converter 15 and the discharge circuit 13 and the discharge detection circuit 59, and the spark rate control circuit 27, the ignition system 11 includes a means of isolating the discharge circuit 13 from the DC source 17. In the illustrated embodiment, the discharge detection circuit 59 includes isolation transformer 71 for isolating the signal from the safety resistor network 33. Furthermore, the ground 74 of the discharge circuit 13 and the primary of the transformer 71 is isolated from the ground 75 of the converter 15 and the spark rate control circuit 27.

In keeping with the invention, the discharge detection circuit 59 produces an adequate reset signal regardless of the precise nature of the discharge event, thereby ensuring normal operation of the electronics of the ignition system at all times. In case of an open circuit at the igniter plug 25, the waveform detected by the discharge detection circuit 59 appears as an exponentially decaying unipolar waveform in the secondary of isolation transformer 71 since the capacitor 19 is discharged through the safety resistors 33.

A healthy discharge waveform sensed at the secondary of transformer 71 is illustrated by waveform (a) of FIG. 4. The discharge event at the healthy plug lasts on the order of a few microseconds as indicated by the time scaling of waveform (a) in FIG. 4. In contrast to the fast discharge the capacitor 19 through the igniter plug 25, a failure of the igniter plug as an open circuit results in a slow exponential discharging of the capacitor through the safety resistor network 33 as suggested by waveform (b) of FIG. 4. When an open circuit failure occurs, the discharging of the capacitor 19 is through the network 33, which causes the energy to be discharged in accordance with the RC constant of the capacitor and the network. Thus, the discharge event is relatively slow as suggested by the exemplary waveform (b) of FIG. 4. Either waveform (a) or (b) of FIG. 4 is received at an input of a buffer 83, which in turn provides a pulse at its output for driving the reset input (R) of the spark rate control latch 51. An exemplary waveform of the output of the buffer 83 is shown in waveform (e) of FIG. 2. The buffer square up signal from transformer 71 as suggested by waveform (e) in FIG. 3 in order to ensure sharp transitions and consistent amplitudes of the pulses delivered to the latch 51.

In keeping with the invention, the discharge detection circuit 29 provides signals that are inherently susceptible to diagnostic processing. The typical failure mode of the discharge circuit 13 is an open circuit at the igniter plug 25 as previously discussed. When such a failure occurs, the voltage waveform is an exponentially discharging waveform as illustrated by the exemplary waveform (b) of FIG. 4. In order to monitor the state of health of the discharge circuit 13 and to provide an output indicative thereof, a diagnostics detector 99 includes a diagnostics detector 99, which may comprise of a pulse width discriminator and missing pulse detector of conventional design for receiving each feedback signal from the discharge detection circuit 29.

The output signals from the discharge detection circuit 29 trigger inputs to a pair of one-shot monostable multivibrators (not shown) comprising the diagnostic detector 99. By the appropriate selection of timing components, the average rate of discharge events is approximately equal to the time periods of the one-shot multivibrator of the diagnostics detector 99 so that the occurrence of an unhealthy discharge event will result in the one-shot timing out and its output transitioning from one level to the other. Specifically, an unhealthy discharge event fails to generate a voltage of proper duration, which in turn then fails to provide a trigger voltage to the diagnostics detector 99. Downstream from the diagnostics detector 99, circuitry (not shown) may be provided to alert maintenance or operating personnel to a failed discharge event. Examples of such circuitry are illustrated in U.S. Pat. No. 5,155,473 to Frus. The circuitry could be a simple latch or it could be more complex circuitry based on statistical occurrences of spark failure -e.g., only repeated failure is detected by inserting a counter between the output and the latch.

Referring now to the operation of the converter circuit 15, a MOSFET switch 27 is responsive to a driver 30 to alternatively connect to ground 75 one end of a primary P of the power transformer 21. The other end of the primary P is hard-wired to the positive terminal (+) of the DC source 17. By alternately turning on and off the MOSFET switch 27, the DC power is pulsed at the transformer 21 and thereby coupled to the discharge circuit 13 by way of a secondary winding S. A diode D1 ensures the energy delivered to the capacitor 19 does not flow back through the transformer 21 and MOSFET switch 27 to ground.

In order to control the MOSFET switch 27 and its driver 30, a current sensing feedback network 29 cooperates with an edge triggered flip-flop 32 and a free-running clock 31. The on/off cycling of the MOSFET switch 27 is pulse-width modulated by the interaction of the current sensing feedback network 29, the flip-flop 32 and the clock 31. As exemplified by waveform (a) in FIG. 5, clock pulses of a predetermined frequency (e.g., 25 kHz) from the free-running clock 31 drive the clock Input of the flip-flop 32. The feedback pulses of the feedback network 29, illustrated by waveform (d) in FIG. 5, drive a reset (R) input of the flip-flop 32, which results in a pulse-width controlled Q output signal from the flip-flop shown by waveform (b) in FIG. 5. The rising edge of the Q output signal from the flip-flop 32 is synchronized with the rising edges of the clock pulses from the clock 31 and the falling edges of the output signals are synchronized with the rising edges of the feedback pulses (waveform (d) of FIG. 3) of the feedback network 29. In the illustrated embodiment, the value of the DC voltage 17 is assumed to be static. Therefore, the length of the pulses in waveform (b) are uniform. In practice, however, the value of the DC voltage 17 varies over a significant range. To compensate for the variable DC voltage 17, the pulse length of the output signals from the flip-flop 31 are modulated such that their lengths become increasingly shorter as the value of the voltage at the DC voltage 17 increases.

As will be appreciated from the waveforms of FIG. 5, the feedback pulses of waveform (d) from the feedback network 29 control the pulse width of the output signals from the flip-flop 32. The feedback network 29 includes a voltage comparator 45 that receives at its positive input a voltage signal from a current sensing resistor 37 connected between the MOSFET switch 27 and ground. The negative input of the voltage comparator 45 is referenced to a voltage source 39 of predetermined value $V_{REF}$. Power for the components of the converter 15 is provided by a logic power supply 43.

When it is turned on, the MOSFET switch 27 provides a means for the power transformer 21 to store energy. This energy is stored in the form of magnetic flux that is developed by a time varying current. This current is sourced from an input reservoir capacitor 41 through the power transformer 21, the MOSFET switch 27, and the current sensing resistor 37. The current rises linearly to a level determined by the feedback network 29. This linear current produces a voltage across the current sensing resistor 37 indicated by waveform (c) of FIG. 5. When this voltage reaches the threshold voltage established by the voltage reference $V_{REF}$, the output of the comparator 45 (which is normally low) transitions to a "logic high." This transition to a logic high resets the flip-flop 32. The flip-flop 32 remains "low," keeping "off" the MOSFET switch 27 until the next rising edge from the free-running clock 31 is received at a clock input of the flip-flip.

During the time the MOSFET switch 27 is off, the energy that was stored in the core of the transformer 21 during the time the switch was on is transferred to the storage capacitor 19, via the flyback diode D1. The converter 15 repeats these cycles until the storage capacitor 19 is charged to the voltage required to breakdown the gap in the spark gap device 23. Each one of the repeated on/off cycling of the switch 27 resulting in the full charging of the capacitor 19 is commonly called a "flyback cycle." A typical time period for charging the capacitor 19 is 100 ms, which is illustrated by waveform (e) in FIG. 5. Inside this 100 ms charging time period, each of the flyback cycles may typically be 40 μs.

For a typical DC power source of 12 to 30 volts, the transformer 21 stores approximately 800 μJ per flyback cycle in accordance with the following equation $\frac{1}{2} L_{pri} I_{pk}^2$, where $L_{pri}$ is the inductance in Henrys of the primary P of the transformer and $I_{pk}$ is the peak current in amperes I flowing through the primary. The discharge circuit 13 stores energy by the following equation $\frac{1}{2} C_{tank} V_{gap}^2$, where $C_{tank}$ is the capacitance of the storage capacitor 19 and $V_{gap}$ is the voltage across the capacitor and the spark gap device 23. With the DC-to-DC converter 15 operating at a frequency of 25 kHz, the storage capacitor 19 charges to a value of the voltage $V_{gap}$ that breaks down the gap of the spark gap device 23 in 100 ms. Exemplary values of the capacitance $C_{tank}$ and of the voltage $V_{gap}$ are 0.66 μf and 2500 V, respectively. In a normal discharge cycle, the capacitor 19 stores approximately two (2) joules of energy.

From the foregoing, it can be appreciated that the ignition system 11 provides a controlled discharge event while employing a free-running discharge circuit 13, which incorporates a two-terminal, passive switch embodied in either the spark-gap discharge device 23 or the passive semiconductor network 40. By providing means for controlling the rate of discharge events, the ignition system 11 marries the improved high voltage converter 15 with the free-running discharge circuit 13, which incorporates a passive switch embodied in either the spark-discharge device 23 or the passive, semiconductor network 40. In either embodiment, the means for controlling the discharge events includes the discharge detection circuit 59 and the spark rate control circuit 27. In this regard, these circuits 27 and 59 detect a discharge event at the safety resistors 33 for the purpose of selectively enabling and disabling the converter circuit 15 in synchronization with the spark rate clock 49 of the spark rate control circuit 27.

We claim:

1. An ignition system responsive to a power source for igniting fuel in a turbine engine, the system comprising:
   an energy storage device;
   means for pumping energy from the power source into the energy storage device;
   an output circuit including an igniter plug;
   a passive device for conducting energy from the energy storage device into the output circuit in order to create a spark event when the energy held in the energy storage device reaches a level that breaks down a high impedance in the passive device, which otherwise prevents the flow of energy from the energy storage to the output circuit;

a sensor for sensing when the spark event occurs and providing a signal indicative thereof; and means responsive to the signal from the sensor for selectively enabling and disabling the pumping means so as to control the rate at which successive spark events occur.

2. An ignition system as set forth in claim 1 wherein the means for selectively enabling and disabling the pumping means includes a bistable output voltage for enabling and disabling the pumping means.

3. An ignition system as set forth in claim 2 wherein the means for selectively enabling and disabling the pumping means includes a spark rate clock and a means for synchronizing clock pulses from the spark rate clock with transitions of the bistable output voltage, which transitions are in response to the signal from the sensor;

thereby providing an average spark rate proportional to the frequency of the clock pulses.

4. An ignition system as set forth in claim 1 wherein the passive device is a spark gap device.

5. An ignition system as set forth in claim 1 wherein the passive device is a network of semiconductor elements.

6. An ignition system as set forth in claim 1 wherein the sensor is a voltage divider network and an isolation transformer.

7. An ignition system as set forth in claim 1 including a diagnostic means responsive to the signal from the sensor for detecting an unhealthy spark event.

8. In an ignition system responsive to a power source for igniting fuel in a turbine engine, wherein the ignition system includes an energy storage device and a passive device coupling the energy storage device to an igniter plug, a method for generating successive spark events at a spark gap of the igniter plug comprising the following sequential steps:

(a) enabling the pumping of energy into the energy storage device;

(b) breaking down a high impedance barrier in the passive device in order to transform the barrier to a low impedance path connecting the energy storage device and the igniter plug;

(c) transferring the energy stored in the energy storage device into the igniter plug by way of the low impedance path in the passive device and thereby creating a spark event at the spark gap of the igniter plug;

(d) sensing the occurrence of the spark event;

(e) disabling the pumping of energy into the energy storage device in response to the sensing of the occurrence of the spark event; and (f) repeating the foregoing steps (a) through (e) so as to establish a controlled rate of successive spark events at the spark gap.

9. A method as set forth in claim 8 wherein the initiation of each repeated step (a) is in synchronization with a reference frequency, thereby providing the ignition system with a constant average spark rate even though the time period between steps (a) through (e) vary as the steps are repeated.

* * * * *